(12) United States Patent
Gale et al.

(10) Patent No.: US 7,897,498 B2
(45) Date of Patent: Mar. 1, 2011

(54) METHOD FOR MANUFACTURING SEMICONDUCTOR DEVICE

(75) Inventors: Glenn Gale, Tokyo-To (JP); Yoshihiro Hirota, Nirasaki (JP); Yusuke Muraki, Nirasaki (JP); Genji Nakamura, Tsukuba (JP); Masato Kushibiki, Nirasaki (JP); Naoki Shindo, Nirasaki (JP); Akitaka Shimizu, Nirasaki (JP); Shigeo Ashigaki, Nirasaki (JP); Yoshihiro Kato, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 480 days.

(21) Appl. No.: 11/794,325

(22) PCT Filed: Nov. 29, 2005

(86) PCT No.: PCT/JP2005/021868
§ 371 (c)(1),
(2), (4) Date: Mar. 14, 2008

(87) PCT Pub. No.: WO2006/070553
PCT Pub. Date: Jul. 6, 2006

(65) Prior Publication Data
US 2008/0268655 A1   Oct. 30, 2008

(30) Foreign Application Priority Data
Dec. 28, 2004   (JP) .............................. 2004-380704

(51) Int. Cl.
*H01L 21/336*   (2006.01)
*H01L 21/8324*  (2006.01)
*H01L 21/76*    (2006.01)
*H01L 21/3205*  (2006.01)
*H01L 21/4763*  (2006.01)

(52) U.S. Cl. ...................... 438/585; 438/197; 438/431; 438/931

(58) Field of Classification Search ................. 438/705
See application file for complete search history.

(56) References Cited

U.S. PATENT DOCUMENTS 5,762,813 A * 6/1998 Takiyama et al. ............. 216/67

(Continued)

FOREIGN PATENT DOCUMENTS

JP       07-161689       6/1995

(Continued)

OTHER PUBLICATIONS

P. Chalker et al., The Electrochemical Society, Inc., $204^{th}$ Meeting of the Electrochemical Society, Co-sponsored in Part by the Electronics Division of The American Ceramic Society, Oct. 12-16, 2003.

(Continued)

*Primary Examiner* — Andy Huynh
*Assistant Examiner* — Valerie Brown
(74) *Attorney, Agent, or Firm* — Finnegan, Henderson, Farabow, Garrett & Dunner, L.L.P.

(57) ABSTRACT

The present invention is a method of manufacturing a semiconductor device from a layered body including: a semiconductor substrate; a high dielectric film formed on the semiconductor substrate; and an SiC-based film formed on a position upper than the high dielectric film, the SiC-based film having an anti-reflective function and a hardmask function. The present invention comprises a plasma-processing step for plasma-processing the SiC-based film and the high dielectric film to modify the SiC-based film and the high dielectric film by an action of a plasma; and a cleaning step for wet-cleaning the SiC-based film and the high dielectric film modified in the plasma-processing step to collectively remove the SiC-based film and the high dielectric film.

9 Claims, 8 Drawing Sheets

U.S. PATENT DOCUMENTS

| | | |
|---|---|---|
| 6,316,167 B1 | 11/2001 | Angelopoulos et al. |
| 6,599,814 B1 | 7/2003 | Vanhaelemeersch et al. |
| 2001/0002731 A1 | 6/2001 | Ueda |
| 2002/0115310 A1 | 8/2002 | Ueda |
| 2002/0119669 A1 | 8/2002 | Ono et al. |
| 2002/0155386 A1* | 10/2002 | Xu et al. ................. 430/312 |
| 2003/0104706 A1 | 6/2003 | Mitsuhashi et al. |
| 2003/0230549 A1 | 12/2003 | Buchanan et al. |
| 2004/0053484 A1* | 3/2004 | Kumar et al. ............. 438/585 |

FOREIGN PATENT DOCUMENTS

| | | |
|---|---|---|
| JP | 07-312336 | 11/1995 |
| JP | 2001-160547 | 6/2001 |
| JP | 2002-252211 | 9/2002 |
| JP | 2003-234325 | 8/2003 |
| JP | 2003-234325 A | 8/2003 |
| JP | 2004-165555 | 6/2004 |

OTHER PUBLICATIONS

K. Babich et al., "A Novel Graded Antireflective Coating with Built-In Hardmask Properties Enabling 65nm and Below CMOS Device Patterning", IEEE, 2003.

European Search Report dated Sep. 24, 2008.

Japanese Office Action issued on Aug. 17, 2010, in corresponding Japanese Patent Application JP 2004-380704.

* cited by examiner

METHOD FOR MANUFACTURING SEMICONDUCTOR DEVICE

FIELD OF THE INVENTION

The present invention relates to a method of manufacturing a semiconductor device.

BACKGROUND ART

With the spread of mobile products represented by cell phones, miniaturization of an LSI has been developed in order to further accelerate a processing speed and to further save a power consumption. There is a tendency that the thickness of a gate insulation film of a transistor is further reduced in accordance with the miniaturization of an LSI.

A silicon oxide film ($SiO_2$) has been conventionally used as a gate insulation film of a MOS transistor. However, a silicon oxide film having a thickness of not more than 2 nm has a poor insulation performance, so that a leak current is increased. With increase in the gate leak current, a power consumption is significantly increased. When such a gate insulation film is employed in a mobile product, an available time of a battery in the mobile product is reduced. In addition, because of a thinner gate insulation film, there is a possibility that impurities such as boron are dispersed from a gate electrode into the gate insulation film. This phenomenon impairs the performance and the reliability of the transistor.

In order to cope with this, use of a high dielectric constant film (High-k film) having a dielectric constant higher than that of $SiO_2$ has been considered. A hafnium-based material ($HfO_2$, $HfSiO_x$, and so on) is regarded as a typical promising material. However, the use of a High-k film in a manufacturing process of a semiconductor device has not been long, there is a lot of room for improvement. For example, establishment of technique for selectively removing a High-k film has been expected.

In a manufacturing process of a gate electrode, a High-k film functions as a stopper of an etching. Thus, the High-k film is selectively left in the etching step. Thereafter, the High-k film is required to be selectively peeled and removed. A chemical agent such as hydrofluoric acid (HF), which has been conventionally used for removing a gate insulation film ($SiO_2$), cannot directly remove the annealed High-k film. Thus, there has been proposed that a wet cleaning is performed after a modification process of a plasma processing, so as to remove the High-k film (see, for example, US Patent Publication No. 2003/0230549, and "Selective Wet Etching of Hf-based Layers" by M. Claes, et al. (204th Meetings of The Electrochemical Society) [See, Website of The Electrochemical Society, Inc; http://www.electrochem.org/meetings/past/204/abstracts/symposia/pif1.htm]")

On the other hand, in a manufacturing process of a gate electrode of a MOS transistor, thicknesses of an anti-reflective coating (ARC) film and a photoresist film, which are used in an etching, are made thinner with a view to miniaturizing the gate electrode. In particular, when an aligner of a high numerical aperture is used, it is more important to make thinner a photoresist film. However, the reduced thickness of the photoresist film may simultaneously make it difficult to accurately etch the film. In order to solve this problem, a hardmask is laid under the photoresist film and the ARC film. Thus, a pattern transfer and a resolution can be improved upon etching. However, in this conventional method of laying a hardmask under the ARC film, an anti-reflective function is not always sufficient, and thus a sufficient resolution and a sufficient lithography process tolerance may not be provided.

Then, there has been proposed an SiC-based film of a multilayer structure having both an anti-reflective function and a hardmask function (see, specification of U.S. Pat. No. 6,316,167, and IEDMTech, dig., p 669, 2003 by K. Babich, et al. (Non-patent Document 1)). With the use of such a film, a significantly excellent anti-reflective function can be obtained, i.e., the reflection in an interface between the film and the photoresist film can be made substantially zero, while allowing the film to exert an appropriate property corresponding to a photoresist and a base film. Further, as compared with the conventional method of laying a hardmask under an ARC film, a resolution and a lithography process tolerance can be remarkably improved.

FIG. 9A to 9H are schematic views showing a part of steps of a conventional gate electrode forming process in which a hardmask is laid under a photoresist film and an ARC film.

FIG. 9A shows a gate layered body which has not been yet etched. On a silicon substrate 201 forming a semiconductor wafer, there is formed a High-k film 202 made of, e.g., $HfO_2$ or $HfSiO_x$, as a gate insulation film. On the High-k film 202, there is formed a polysilicon film 203. On the polysilicon film 203, there are formed a hardmask 204 made of, e.g., silicon dioxide or silicon nitride, and an ARC film 205. On the ARC film 205, there is formed a patterned photoresist film 210.

At first, as shown in FIG. 9B, the ARC film 205 and the hardmask film 204 are etched with the photoresist film 210 used as a mask. Then, as shown in FIG. 9C, the photoresist film 210 is removed. Thereafter, the polysilicon film 203 is etched with the ARC film 205 and the hardmask film 204 used as a mask. As shown in FIG. 9D, due to the etching of the polysilicon film 203, the ARC film 205 is also removed (a film-thickness of the hardmask film 204 is also reduced).

Then, as shown in FIG. 9E, the High-k film 202, which has been exposed by etching the polysilicon film 203, is subjected to a plasma processing. In this step, the High-k film 202 is modified into a porous material mainly by an action of ions contained in the plasma.

After the modification step, as shown in FIG. 9F, an exposed part of the High-k film 202 is peeled and removed by a wet cleaning (wet etching) using a chemical liquid such as HF. Then, as shown in FIG. 9G, a sidewall 207 is formed around the gate layered body. Thereafter, the remaining hardmask 204 is peeled and removed by a combination of the plasma modification process and the wet cleaning. As a result, a gate structure as shown in FIG. 9H can be obtained.

With the above-described series of steps, a gate electrode is formed. In the above conventional art, removal of the High-k film 202 and removal of the hardmask 204 are performed in the steps independent from each other. In other words, the plasma processing and the wet cleaning are repeated twice, respectively. Such an increased number of steps invites problems such as deterioration in a device caused by a plasma damage, side-etching of a gate insulation film in a wet cleaning step, and film-reduction of a buried insulation film.

When a novel material, such as an SiC-based film of a multilayer structure having both an anti-reflective function and a hardmask function, which is shown in the specification of U.S. Pat. No. 6,316,167, and IEDMTech, dig., p 669, 2003 by K. Babich, et al., is used in place of a combination of the ARC and the hardmask, it is necessary to establish a process for efficiently, reliably removing the SiC-based film. However, when a gate electrode is manufactured out of a layered body including an SiC-based film of a multilayer structure and a High-k film as a gate insulation film, the repeated independent removing steps like the conventional process (FIG. 9A to FIG. 9H) may give an adverse effect on a semiconductor device.

SUMMARY OF THE INVENTION

The present invention has been made taking account of the above-described problems to effectively solve the same. The object of the present invention is to provide a method of manufacturing a semiconductor device, which is capable of efficiently, reliably removing an SiC-based film of a multi-layer structure having both an anti-reflective function and a hardmask function, while simplifying a removing step of the film in a gate electrode forming process, thereby reducing an adverse effect on the device as much as possible.

The present invention is a method of manufacturing a semiconductor device from a layered body including: a semiconductor substrate; a high dielectric film formed on the semiconductor substrate; and an SiC-based film formed on a position upper than the high dielectric film, the SiC-based film having an anti-reflective function and a hardmask function; the method comprising: a plasma-processing step for plasma-processing the SiC-based film and the high dielectric film to modify the SiC-based film and the high dielectric film by an action of a plasma; and a cleaning step for wet-cleaning the SiC-based film and the high dielectric film modified in the plasma-processing step to collectively remove the SiC-based film and the high dielectric film.

Alternatively, the present invention is a method of manufacturing a semiconductor device from a layered body including: a semiconductor substrate; a high dielectric film formed on the semiconductor substrate; a polysilicon film formed on the high dielectric film; and an SiC-based film formed on a position upper than the polysilicon film, the SiC-based film having an anti-reflective function and a hardmask function; the method comprising the steps of: a first etching step for etching the SiC-based film by using a patterned resist as a mask; a second etching step for etching the polysilicon film by using the SiC-based film as a mask; a plasma-processing step for plasma-processing the SiC-based film and the high dielectric film exposed by the second etching step to modify the SiC-based film and the high dielectric film by an action of a plasma; and a cleaning step for wet-cleaning the SiC-based film and the high dielectric film modified in the plasma-processing step to collectively remove the SiC-based film and the high dielectric film.

According to these inventions, the SiC-based film can be efficiently, reliably removed by a combination of the plasma-processing step and the cleaning step. Further, removal of the SiC-based film and removal of the High-k film can be collectively conducted in a single step. Since the number of steps can be reduced, throughput in a process for forming a gate electrode of a transistor and so on can be improved, while manufacturing costs can be reduced.

Since two types of films of different functions can be removed in a single removing step, deterioration in a device caused by a plasma damage can be prevented as much as possible. In addition, side edges of a gate insulation film and film-reduction of a buried insulation film (BOX) can be restrained as much as possible. As a result, deterioration in device properties and lowering of throughput can be significantly prevented.

For example, a process gas containing $O_2$ is used in the plasma-processing step.

In this case, preferably, the process gas containing $O_2$ is a gas containing $O_2$ and $CF_4$, and a flowrate ratio of $O_2:CF_4$ is from 1000:5 to 1000:1.

In addition, a chemical liquid containing hydrofluoric acid is used in the cleaning step, for example. In this case, preferably, the chemical liquid containing hydrofluoric acid is a chemical liquid containing hydrofluoric acid and glycols such as ethylene glycol and propylene glycol.

In addition, the present invention is a system of manufacturing a semiconductor device comprising: an ashing apparatus for modifying a semiconductor substrate by a plasma; a cleaning apparatus for wet-cleaning a semiconductor substrate; and a controller for controlling the ashing apparatus and the cleaning apparatus to perform the method of manufacturing a semiconductor device having the above features.

A program for controlling a method of manufacturing a semiconductor device having the above features, and a computer-readable storage medium storing the program are statutory subject matters of the present invention.

BEST MODE FOR CARRYING OUT THE INVENTION

Embodiments of a method of manufacturing a semiconductor device according to the present invention will be described below with reference to the accompanying drawings.

FIGS. 1A to 1G are schematic views of cross-sections of a wafer in the order of a gate electrode forming process of a MOS transistor in one embodiment of the present invention. FIG. 2 is a flowchart showing major steps in the gate electrode forming process shown in FIGS. 1A to 1G.

Figure 1A:
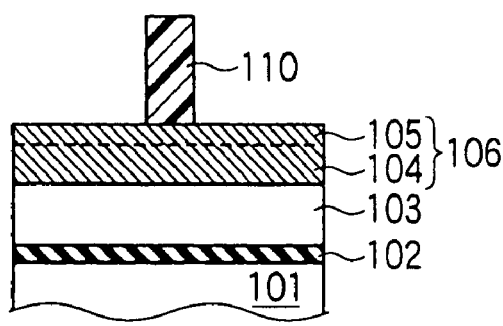
FIGS. 1A to 1G are schematic views of cross-sections of a wafer in the order of a gate electrode forming process in one embodiment of the present invention.
Figure 2:
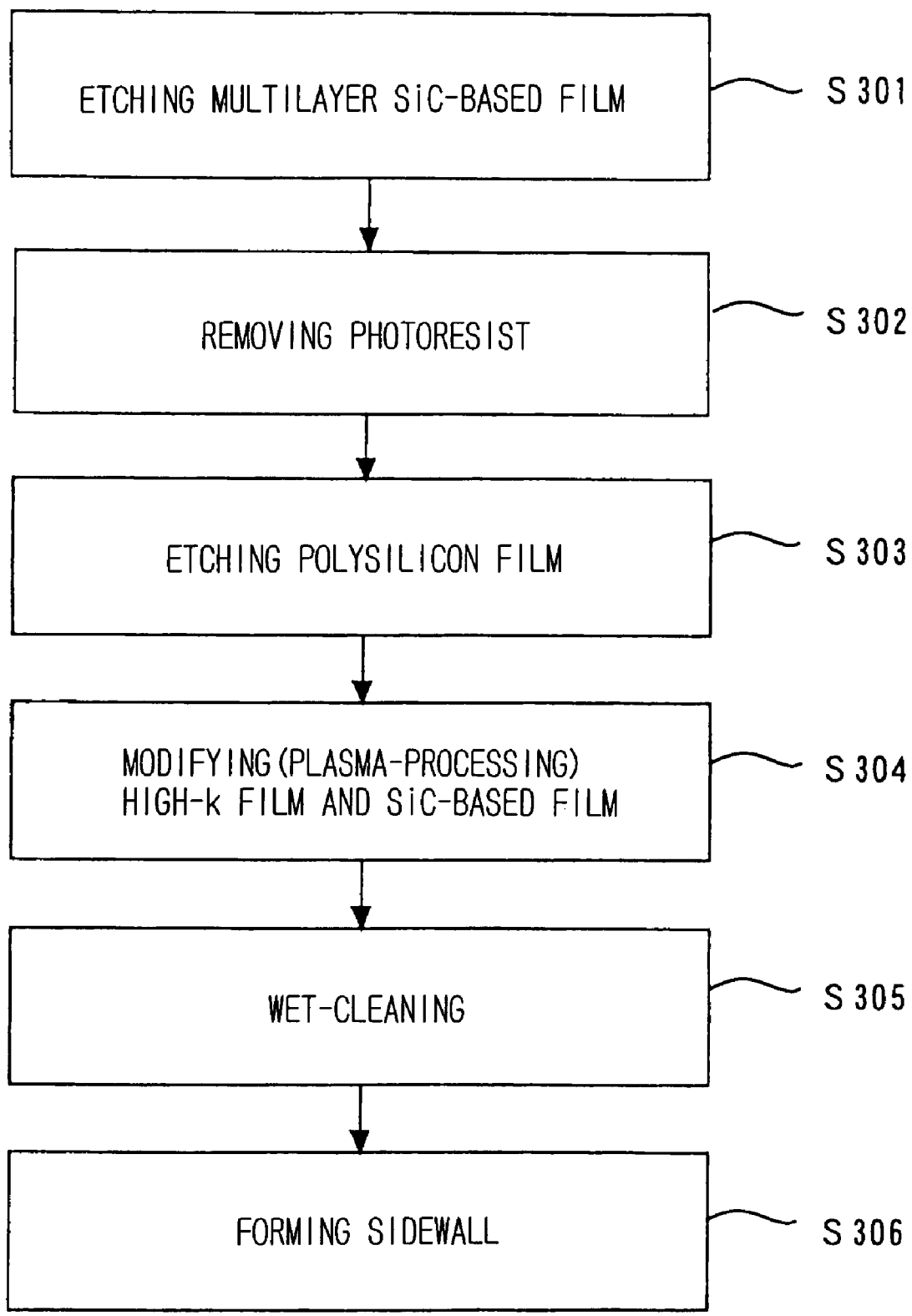
FIG. 2 is a flowchart showing major steps in the gate electrode forming process shown in FIGS. 1A to 1G.

FIG. 1A shows a layered body structure of a gate forming part before it is etched. On a silicon substrate 101 forming a semiconductor wafer W, there is formed as a gate insulation film a High-k film 102 made of, e.g., $HfO_2$ or $HfSiO_x$. The High-k film 102 may be formed by a CVD, for example. On the High-k film 102, there is formed a polysilicon film 103 by a CVD, for example. On the polysilicon film 103, there is formed an SiC-based film 106 made of, e.g., SiCH and SiCOH. Further, on the SiC-based film 106, a patterned photoresist film 110 is formed.

The SiC-based film 106 is of a two-layer structure including: a mask functioning film 104 made of an SiCH material for functioning as a hardmask; and an ARC film 105 made of an SiCOH material for functioning as an ARC. Such an SiC-based film 106 is disclosed in the Non-Patent Document 1, and is provided by IBM corporation under the trade name "TERA".

The SiC-based film 106 is a film of a multilayer structure formed by a plasma CVD. In accordance with materials of a base film (polysilicon film 103 in this embodiment) and the photoresist film 110, a complex index of refraction of the SiC-based film 106, which is represented by the equation n+ik (in which n indicates a refractive index, and k indicates an extinction coefficient) when each film is exposed to a light of a certain wavelength, is adjusted. For example, when a light has a wavelength of 193 nm, n of each film is adjusted to be about 1.62 to 2.26, and k is adjusted to be about 0.045 to 0.75. These values can be adjusted by varying a film-deposition condition such as a film-deposition temperature, a pressure, a flowrate, and a gas composition.

To be specific, the ARC film 105 made of SiCOH which is adjacent to the photoresist film 110, and the mask functioning film 104 made of SiCH which is adjacent to the polysilicon film 103 to be etched, may constitute a two-layer structure in which n and k of one film differ from n and k of the other film. By adjusting the values of n and k and the film-thicknesses, an excellent anti-reflective function can be realized (a reflectivity in an interface between the SiC-based film 106 and the photoresist film 110 can be made substantially zero). In addition, a sufficient resolution can be obtained in a recent photolithography process using an ArF (having a wavelength of 193 nm) intended for a patterning of 65 nm CMOS, and further in a photolithography process using an F2 (having a wavelength of 157 nm) and/or an EUV intended for a next-generation patterning of 65 nm or less. Since the SiC-based film is an inorganic film, the SiC-based film can be etched at a high selectivity relative to the photoresist film 110. A high selectivity can be also obtained relative to the polysilicon film 103 to be etched. Namely, the SiC-based film is capable of fulfilling an excellent hardmask function.

Figure 1E:
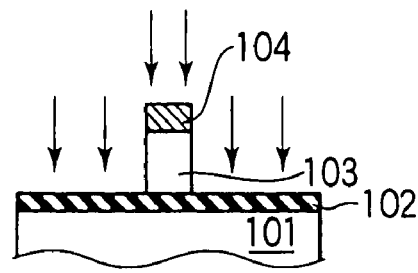
Figure 1B:
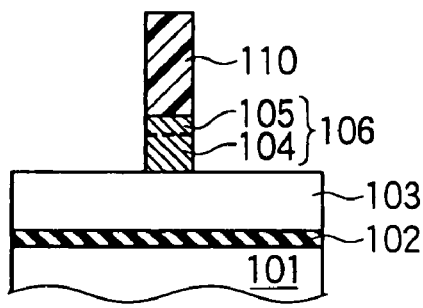

FIG. 1B shows a state in which the ARC film 105 and the mask functioning film 104 have been etched by using the photoresist film 110 as a mask in a step S301 (see, FIG. 2). The etching of the ARC film 105 and the mask functioning film 104 can be conducted by a dry etching using an $SF_6$-based gas, for example.

Figure 1F:
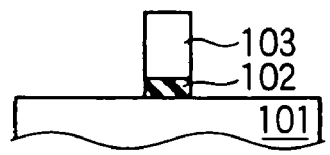
Figure 1C:
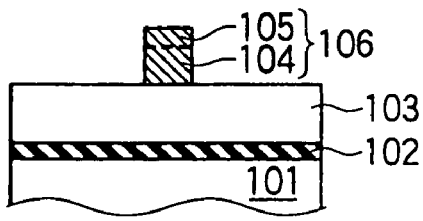

FIG. 1C shows a state in which the photoresist film 110 has been removed in a step S302 (see, FIG. 2) but the polysilicon film 103 is not yet etched.

Figure 1G:
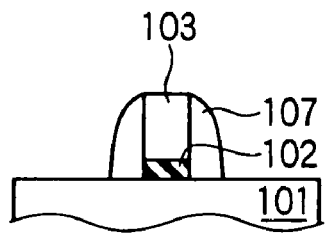
Figure 1D:
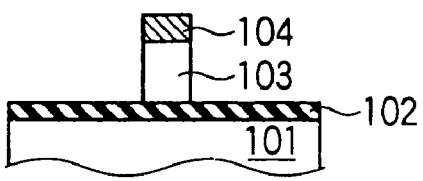

FIG. 1D shows a state in which a step S303 (see, FIG. 2) has been performed, i.e., the polysilicon film 103 has been etched by using the ARC film 105 and the mask functioning film 104 as a mask. At this stage, the ARC film 105 is removed by the etching, and a film-thickness of the mask functioning layer 104 is reduced.

FIG. 1E shows a state in which the High-k film 102 and the mask functioning film 104, which have been exposed by etching the polysilicon film 103, are subjected to a plasma processing (step S304). In this step, the High-k film 102 and the mask functioning film 104 are oxidized by an action of ions in the plasma, so that the High-k film 102 and the mask functioning film 104 are modified into porous materials. Conditions of the plasma processing for modifying the films will be described in detail below.

FIG. 1F shows a state in which the High-k film 102 and the mask functioning film 104 have been etched by a wet cleaning (wet etching) in a step S305 (see, FIG. 2). Since the High-k film 102 and the mask functioning film 104 have been made porous by the plasma processing, the High-k film 102 and the mask functioning film 104 can be collectively removed by a single step. As described below, the wet cleaning may be carried out with the use of a dip-type cleaning apparatus or a spin-type cleaning apparatus.

FIG. 1G shows a state in which a sidewall 107 has been formed around the gate layered body as obtained above by a CVD in a step S306 (see, FIG. 2).

Although drawings and descriptions are omitted, in line with the general method, formation of a source area, formation of a drain area, deposition of an interlayer insulation film, formation of a contact hole, and so on are carried out so as to manufacture a gate electrode of a MOS transistor.

FIGS. 3A to 3H are schematic views of cross-sections of a wafer in the order of a gate electrode forming process of a MOS transistor in another embodiment of the present invention. FIG. 4 is a flowchart showing major steps in the gate electrode forming process shown in FIG. 3A to 3H.

Figure 3A:
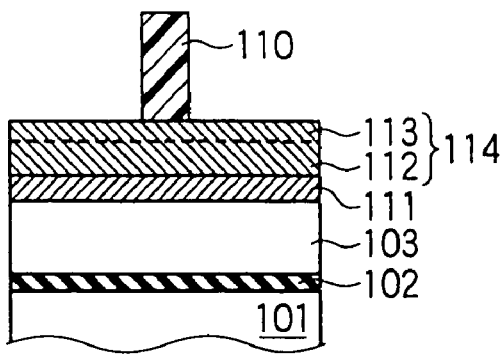
FIGS. 3A to 3H are schematic views of cross-sections of a wafer in the order of a gate electrode forming process in another embodiment of the present invention.
Figure 4:
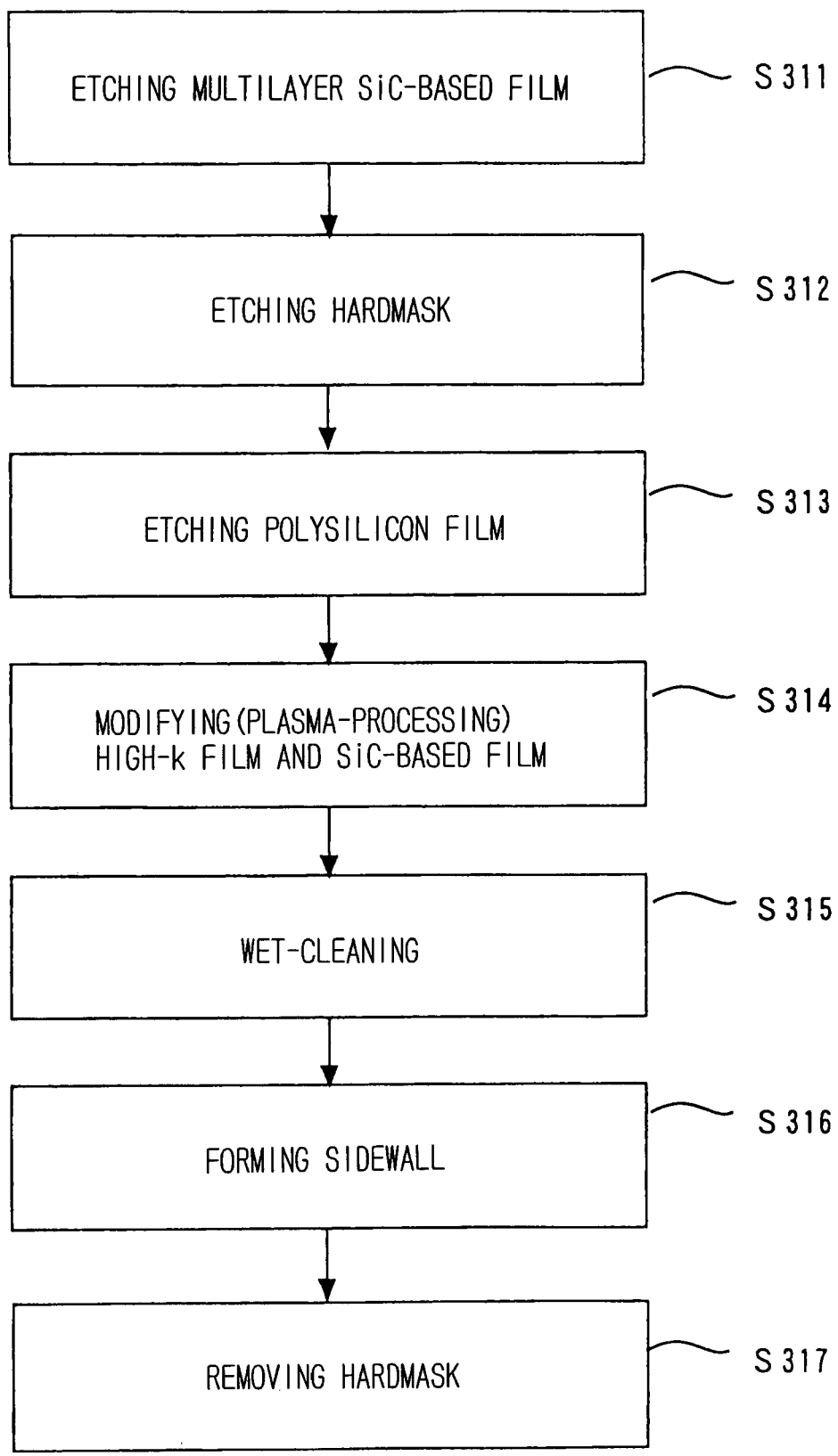
FIG. 4 is a flowchart showing major steps in the gate electrode forming process shown in FIG. 3A to 3H.

FIG. 3A shows a layered body structure of a gate forming part before it is etched. On a silicon substrate 101 forming semiconductor wafer W, there is formed as a gate insulation film a High-k film 102 made of e.g., $HfO_2$ or $HfSiO_x$. The High-k film 102 is formed by a CVD, for example. On the High-k film 102, there is formed a polysilicon film 103 by a CVD, for example. On the polysilicon film 103, a hardmask film 111 made of, e.g., silicon oxide ($SiO_2$) or silicon nitride ($Si_3N_4$). On the hardmask film 111, there is formed an SiC-based film 114 made of, e.g., an SiCH material and an SiCOH material. Further, on the ic-based film 114, a patterned photoresist film 110 is formed.

The SiC-based film 114 is of a two-layer structure including: a first ARC film 112 having a hardmask function; and a second ARC film 113 whose composition differs from that of the first ARC film 112. The first ARC film 112 is a film that contains e.g., SiCH as a principal component, which composition gives priority to a hardmask function. The second ARC film 113 contains, e.g., SiCOH as a principal component. Due to the two-layered structure including the two ARC films, an anti-reflective property can be optimized.

Figure 3E:
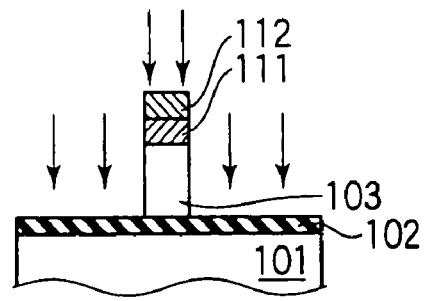
Figure 3B:
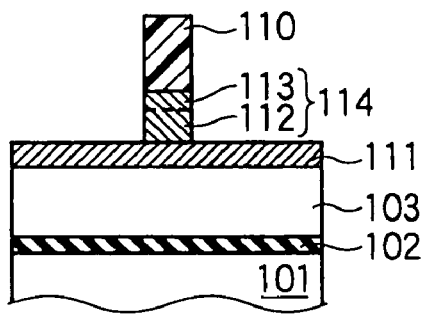

FIG. 3B shows a state in which the first ARC film 112 and the second ARC film 113 have been etched by using the photoresist mask 110 as a mask in a step S311 (see, FIG. 4). The etching of the first ARC film 112 and the second ARC film 113 can be conducted by a dry etching using an $SF_6$-based gas, for example. A film-thickness of the photoresist film 110 has been reduced by this etching.

Figure 3F:
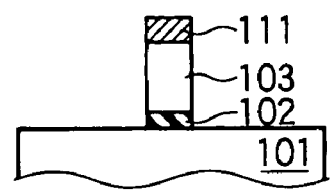
Figure 3C:
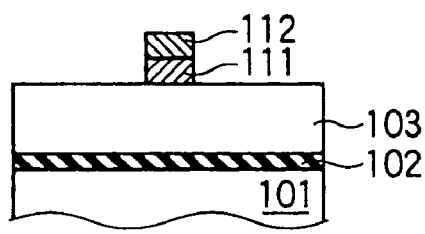

FIG. 3C shows a state in which the hardmask film 111 has been dry-etched by a $CF_4$-based gas by using the first ARC film 112 and the second ARC film 113 as a mask in a step S312 (see, FIG. 4) but the polysilicon film 103 is not yet etched. At this stage, the photoresist film 110 and the second ARC film 113 are removed, and a film-thickness of the first ARC film 112 is reduced.

Figure 3G:
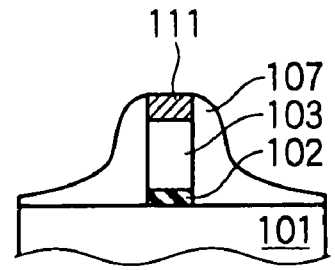
Figure 3D:
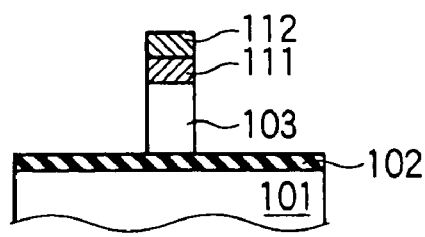

FIG. 3D shows a state in which the polysilicon film 103 has been dry-etched by an HBr gas or a $Cl_2$ gas by using the first ARC film 112 and the hardmask film 111 as a mask in a step S313 (see, FIG. 4).

FIG. 3E shows a state in which the High-k film 102, the first ARC film 112, and the hardmask film 111, which have been exposed by etching the polysilicon film 103, are subjected to a plasma processing (step S314). In this step, the High-k film 102 and the first ARC film 112 are oxidized by an action of ions in the plasma, so that the High-k film 102 and the first ARC film 112 are modified into porous materials. Conditions of the plasma processing for modifying the films will be described in detail below.

FIG. 3F shows a state in which the High-k film 102 and the first ARC film 112 have been etched by a wet cleaning (wet etching) in a step S315 (see, FIG. 4). Since the High-k film 102 and the first ARC film 112 have been made porous by the plasma processing, the High-k film 102 and the first ARC film 112 can be collectively removed by a single step. As described below, the wet cleaning may be carried out with the use of a dip-type cleaning apparatus or a spin-type cleaning apparatus.

FIG. 3G shows a state in which a sidewall 107 has been formed around the gate layered body as obtained above by a CVD in a step S316 (see, FIG. 4).

Figure 3H:
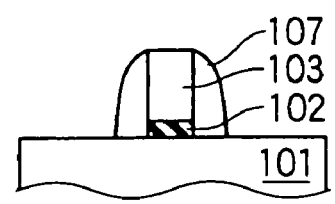

FIG. 3H shows a state in which the remaining hardmask 111 has been removed in a step S317 (see, FIG. 4). The hardmask 111 may be removed by a dry etching using a $CHF_3$ gas or a $CF_4$ gas, which are used when the sidewall 107 is etched, or by a wet etching by an HF-based chemical liquid.

Although drawings and descriptions are omitted, in line with the general method, formation of a source area, formation of a drain area, deposition of an interlayer insulation film, formation of a contact hole, and so on are carried out so as to manufacture a gate electrode of a MOS transistor.

Figure 5:
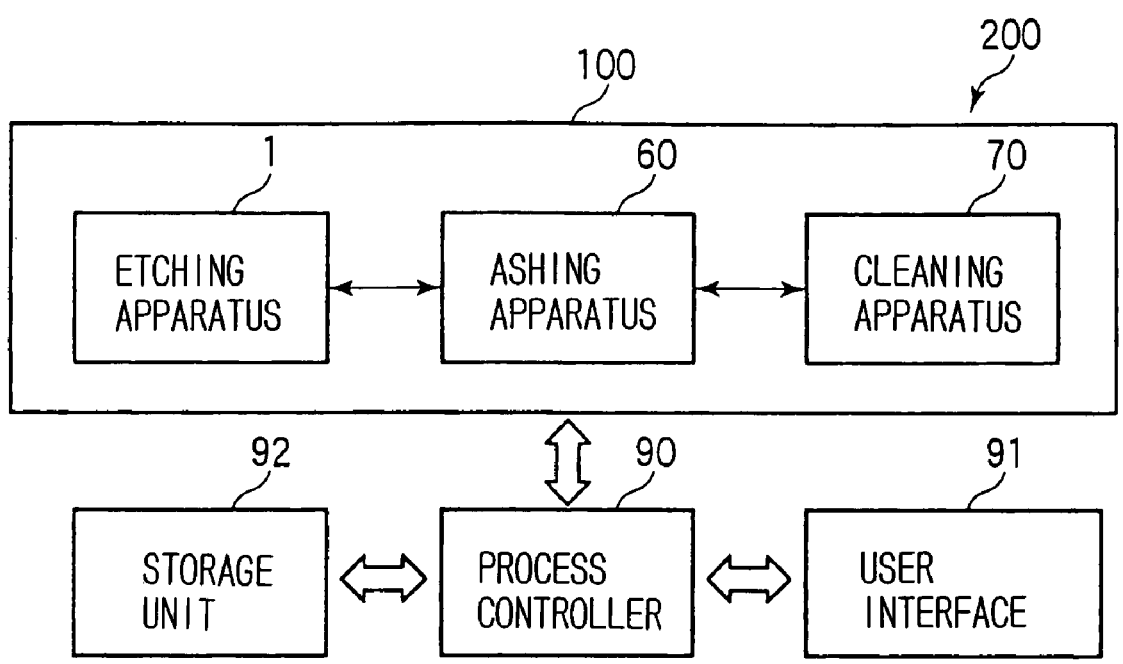
FIG. 5 is a schematic block diagram showing a manufacturing system of a semiconductor device, which is adapted for carrying out the present invention.

FIG. 5 is a block diagram showing a system of manufacturing a semiconductor device 200 which is adapted for carrying out the present invention. The semiconductor-device manufacturing system 200 includes a processing part 100 having: an etching apparatus 1 for performing an etching process by a plasma; an ashing apparatus 60 for performing a modification process by a plasma; and a cleaning apparatus 70 for performing a wet cleaning. In addition to the processing part 100, there are disposed a process controller 90, a storage unit 92, and a user interface 91. (Herein, description is made only matters relating to a plasma etching process (dry etching), a modification process (plasma ashing), and a wet cleaning process (wet etching)).

The respective apparatuses in the processing part 100 are connected to the process controller 90 including a CPU, so that the apparatuses are controlled by the process controller 90.

To the process controller 90, there are connected the user interface 91 and the storage unit 92. The user interface 91 includes a keyboard used by a process manager for inputting commands for managing the respective apparatuses in the processing part 100, and a display for visually displaying operating conditions of the respective apparatuses in the processing part 100. The storage unit 92 stores a control program and recipes recording process condition data for realizing various processes performed by the processing part 100 under the control of the process controller 90.

As circumstances demand, a given recipe is called from the storage unit 92 based on instructions from the user interface 91, and the recipe is executed by the process controller 90. Under the control of the process controller 90, various desired processes are performed by the processing part 100. There is used the recipes stored in a readable storage medium such as a CD-ROM, a hard disk, a flexible disk, and a nonvolatile memory. Alternatively, the recipe can be used in online through a private line between the respective apparatuses, or a private line from an external apparatus.

Figure 6:
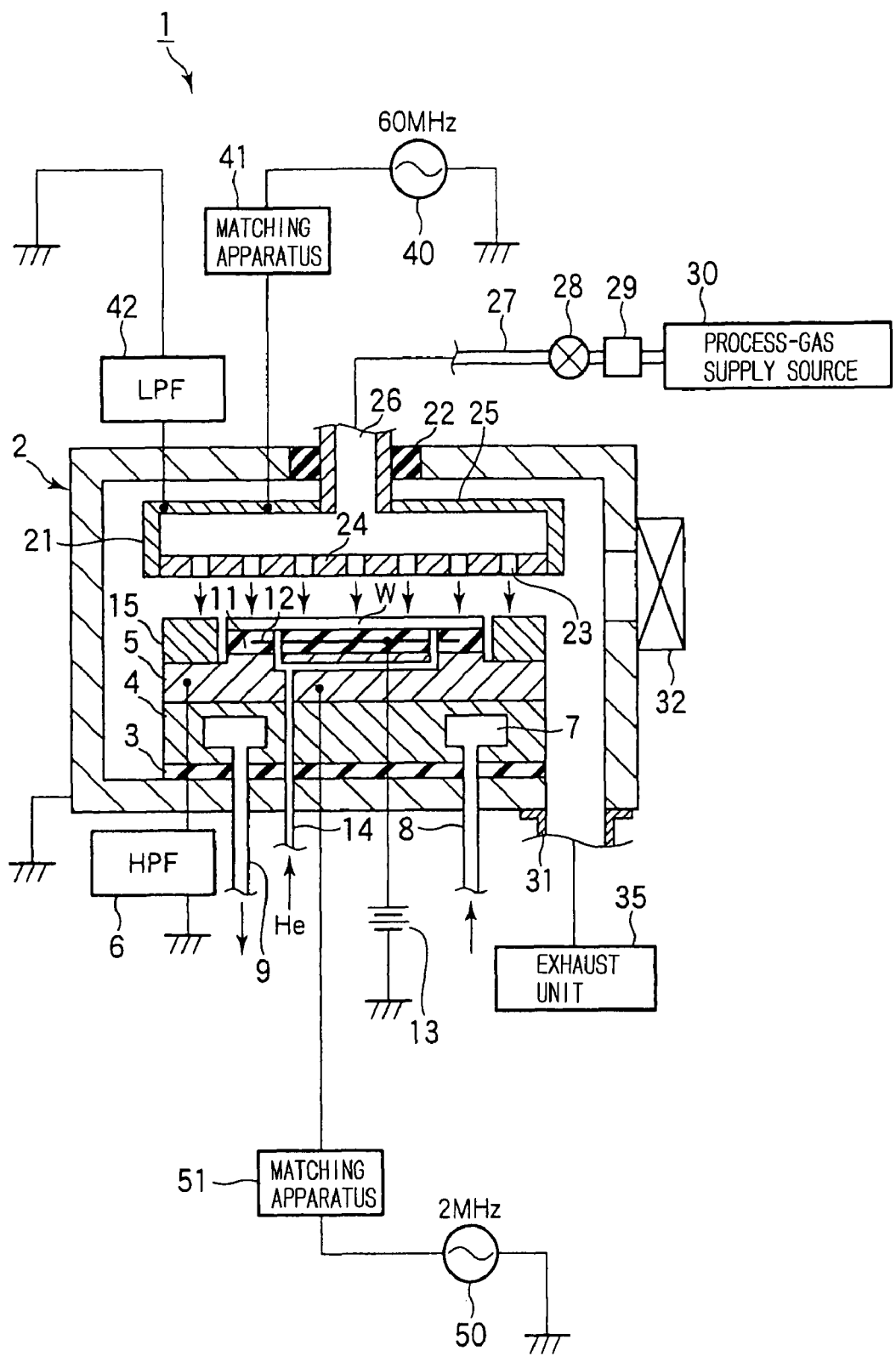
FIG. 6 is a schematic view of an example of an etching apparatus.

FIG. 6 is a schematic view of an example of an etching apparatus capable of being used for the present method. The etching apparatus 1 is a parallel plate plasma etching apparatus of a capacity-coupled type, in which upper and lower electrode plates are opposed in parallel to each other, and radiofrequency power sources are respectively connected to the electrode plates.

The etching apparatus 1 includes a cylindrical aluminum chamber 2 whose surface has been anodized, for example. The chamber 2 is grounded. In the chamber 2, a susceptor 5 made of, e.g., silicon is supported by a susceptor supporting table 4. A wafer W as an object to be processed, on which a predetermined film has been formed, is horizontally placed on the susceptor 5. The susceptor 5 also serves as a lower electrode, and a highpass filter (HPF) 6 is connected thereto.

A temperature-adjusting medium chamber 7 is disposed in the susceptor supporting table 4. A temperature-adjusting medium is introduced through an inlet pipe 8 into the temperature-adjusting medium chamber 7, and is circulated therethrough. Thus, the susceptor 5 can be controlled at a desired temperature.

An upper center part of the susceptor 5 is formed into a projected circular plate. An electrostatic chuck 11 having substantially the same shape as that of the wafer W is disposed on an upper surface of the projected circular plate. The electrostatic chuck 11 has an electrode 12 interposed between insulation materials. A direct-current voltage of e.g., 1.5 kV is applied to the electrode 12 from a direct-current power source 13 connected to the electrode 12. Thus, the wafer W is electrostatically attracted and held by a Coulomb force.

A gas passage 14 through which a heating medium, such as an He gas, is supplied at a predetermined pressure (back pressure) to a rear surface of the wafer W as an object to be processed, is formed in an insulation plate 3, the susceptor supporting table 4, the susceptor 5, and the electrostatic chuck 11. Heat is transmitted between the susceptor 5 and the wafer W through the heating medium. Thus, the wafer W can be maintained at a predetermined temperature.

An annular focus ring 15 is disposed around an upper peripheral part of the susceptor 5 to surround the wafer W placed on the electrostatic chuck 11. The focus ring 15 is made of an insulation material such as ceramics or quartz. A function of the focus ring 15 is to improve uniformity in etching process.

An upper electrode 21 is disposed above the susceptor 5 such that the upper electrode 21 is opposed in parallel to the susceptor 5. The upper electrode 21 is supported by an upper part of the chamber 2 via an insulation material 22. The upper electrode 21 includes an electrode plate 24 having a surface opposed to the susceptor 5 with a plurality of discharge holes 23, and an electrode supporting member 25 for supporting the electrode plate 24. The electrode plate 24 is made of, e.g., aluminum. The electrode supporting member 25 is made of a conductive material such as aluminum whose surface has been anodized. A distance between the susceptor 5 and the upper electrode 21 can be adjusted.

A gas inlet port 26 is formed in a center part of the electrode supporting member 25 of the upper electrode 21. A gas supply pipe 27 is connected to the gas inlet port 26. A process-gas supply source 30 is connected to the gas supply pipe 27 via a valve 28 and a massflow controller 29. Thus, an etching gas for a plasma etching can be supplied from the process-gas supply source 30 into the gas inlet port 26.

Although FIG. 6 illustrates only one process-gas supply source 30 as a representative example, there are generally disposed the plurality of process-gas supply source 30. Gases such as Ar, $N_2$, $Cl_2$, $O_2$, $CF_4$, $NF_3$, $CH_4$, $CHF_3$, $SF_6$, and HBr are supplied into the chamber 2, with flowrates thereof being independently controlled.

An exhaust pipe 31 is connected to a bottom part of the chamber 2. An exhaust unit 35 is connected to the exhaust pipe 31. The exhaust unit 35 is provided with a vacuum pump such as a turbo-molecular pump. Thus, an inside of the chamber 2 can be evacuated to a predetermined decompression atmosphere, e.g., at a predetermined pressure not more than 1 Pa. A gate valve 32 is disposed on a sidewall of the chamber 2. While the gate valve 32 is being opened, the wafer W can be transferred between the chamber 2 and an adjacent load-lock chamber (not shown).

A first radiofrequency power source 40 is connected to the upper electrode 21. A matching apparatus 41 is provided on a feeder of the first radiofrequency power source 40. A lowpass filter (LPF) 42 is connected to the upper electrode 21. The first radiofrequency power source 40 has a frequency of from 50 to 150 MHz. By applying such a high frequency to the upper electrode 21, a high-density plasma in a desired dissociation state can be generated in the chamber 2, whereby a plasma processing under a low pressure condition can be achieved. In particular, a frequency of the first radiofrequency power source 40 is preferably 50 to 80 MHz. As shown in FIG. 6, a frequency of 60 MHz or around 60 MHz is typically employed.

A second radiofrequency power source 50 is connected to the susceptor 5 as a lower electrode. A matching apparatus 51 is provided on a feeder of the second radiofrequency power source 50. The second radiofrequency power source 50 has a frequency of from some hundreds kHz to some tens MHz. By applying a power of such a frequency to the lower electrode, the wafer W can be subjected to an appropriate ion action, without being damaged. As shown in FIG. 6, a frequency of 2 MHz or 800 KHz is employed as a frequency of the second radiofrequency power source 50.

Next, a process for etching the wafer W by the etching apparatus 1 as constituted above will be described below.

At first, the gate valve 32 is opened, and a wafer W is loaded from the load-lock chamber, not shown, into the chamber 2 and is placed on the electrostatic chuck 11. By applying a direct-current voltage from the high-pressure direct-current power source 13, the wafer W is electrostatically attracted and held by electrostatic chuck 11.

Then, the gate valve 32 is closed, and the inside of the chamber 2 is evacuated by the exhaust unit 35 to a predetermined vacuum degree. Thereafter, the valve 28 is opened and an etching gas such as $CF_4$ is supplied from the process-gas supply source 30 with a flowrate thereof being controlled by the massflow controller 29 at a predetermined flowrate (for example, 50 mL/min). The gas passes through the process gas supply pipe 27, the gas inlet port 26, a hollow portion of the upper electrode 21, and the discharge holes 23 in the electrode plate 24, and is then uniformly discharged onto the wafer W, as shown by the arrows in FIG. 6.

A pressure in the chamber 2 is maintained at a predetermined pressure, such as a pressure of 1.3 to 13.3 Pa. A radiofrequency voltage of 200 W is applied from the first radiofrequency power source 40 to the upper electrode 21, and a radiofrequency voltage of 200 W is applied from the second radiofrequency power source 50 to the susceptor 5 as a lower electrode. Thus, the etching gas is made plasma so that the wafer W is etched.

Next, the ashing apparatus 60 is described. A parallel plate plasma etching apparatus of a capacity-coupled type, which is of the same structure as that of the etching apparatus 1 shown in FIG. 6, can be used as the ashing apparatus 60. That is to say, the modification process of an SiC-based film and a High-k film by a plasma can be performed by an apparatus of the same structure as that of the etching apparatus 1 shown in FIG. 6, except only for a different process gas supplied from the process-gas supply source 30. Thus, illustration of the ashing apparatus 60 and description of a structure thereof are omitted, and only conditions of the modification process are described below. It is possible to perform the etching process and the modification process in the same chamber of an apparatus serving both as the etching apparatus 1 and as the ashing apparatus 60.

Conditions of the modification process by the ashing apparatus 60 are as follows. Namely, a gas containing, e.g., $O_2$ may be used as a process gas. It is particularly preferable to use a mixed gas of $O_2$ and $CF_4$. In this case, the $O_2$ and the $CF_4$ are supplied into the chamber, with a mixed ratio of the $O_2$ and the $CF_4$ being adjusted by the massflow controller 29 such that the ratio is within a predetermined range such as 1000:5 to 1000:1.

A temperature of the wafer W is maintained at about 250° C., for example. A pressure in the chamber 2 is maintained at, for example, about 1.3 to 13.3 Pa, preferably 2.7 to 8 Pa. On the other hand, a radiofrequency voltage of 10 to 2500 W is applied from the radiofrequency power source 40 to the upper electrode 21, and a radiofrequency voltage of 10 to 2500 W is applied from the second radiofrequency power source 50 to the susceptor 5 as a lower electrode. Thus, the process gas is made plasma and the plasma acts on the SiC-based film and the High-k film. Thus, the SIC-based film and the High-k film are oxidized and made porous. The SiC-based film and the High-k film, which have been made porous, can be easily peeled and removed by a wet cleaning conducted under the predetermined conditions as described below.

Figure 7:
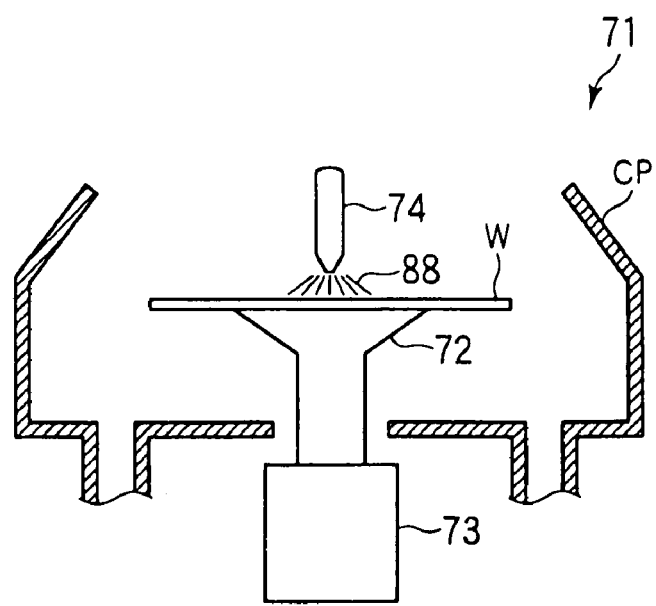
FIG. 7 is a schematic view of an example of a spin-type cleaning apparatus.

FIG. 7 is a schematic view of a spin-type cleaning apparatus 71 capable of being used as the cleaning apparatus 70. The spin-type cleaning apparatus 71 includes a cup CP, a spin chuck 72 disposed in the cup CP for horizontally attracting and holding the wafer W, a motor 73 for rotating the spin chuck 72, and a nozzle 74 for supplying a chemical liquid 88. The spin-type cleaning apparatus 71 is configured to wet-clean the wafer W, by spraying the chemical liquid 88 from the nozzle 74 onto a center of the wafer W, and by simultaneously rotating the spin chuck 72 and the wafer W attracted and held thereon by the motor 73 to disperse the chemical liquid 88 over all the surface of the wafer W.

In the wet-cleaning process by the spin-type cleaning apparatus 71, it is preferable to use the chemical liquid 88 containing HF and ethylene glycol with a mixed ratio thereof being 1:1 to 1:50, more preferably 1:10 to 1:20. It is also preferable that a temperature of the chemical liquid 88 is a room temperature, and that the chemical liquid 88 is supplied at 10 to 100 ml per wafer unit area ($cm^2$).

Figure 8:
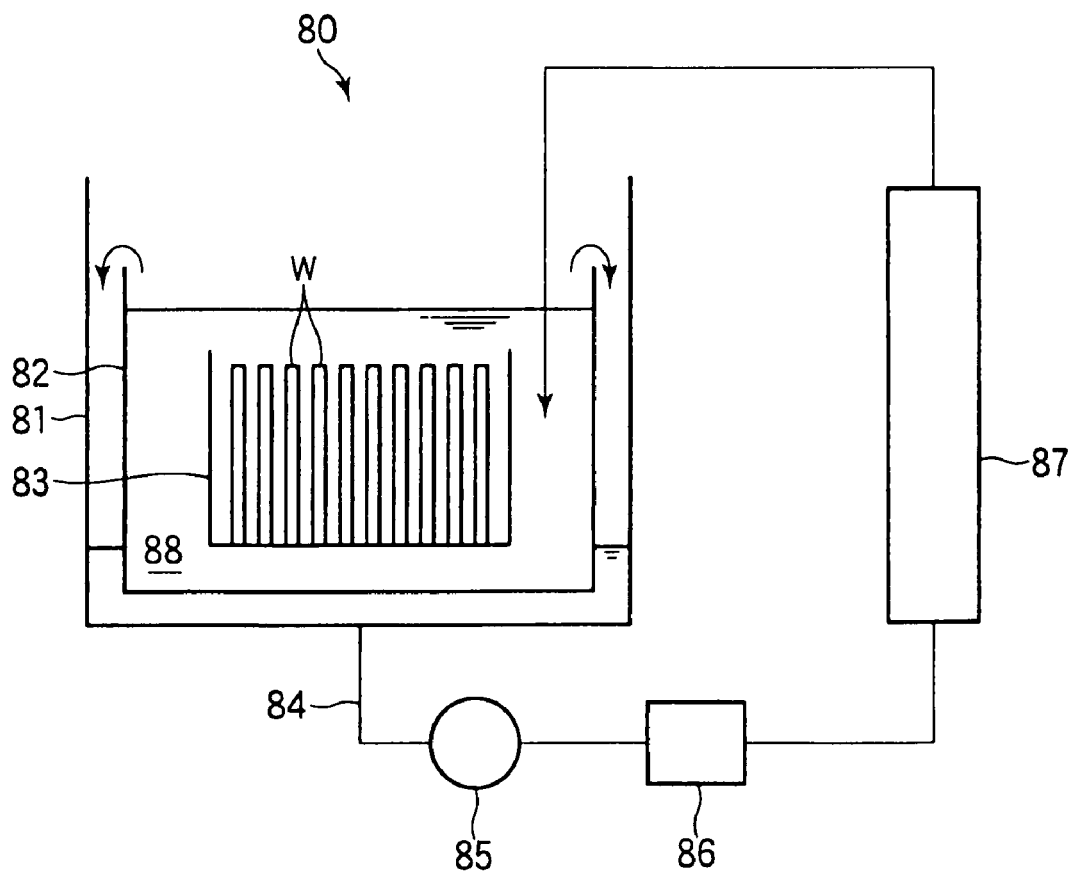
FIG. 8 is a schematic view of an example of a dip-type cleaning apparatus.
Figure 9A:
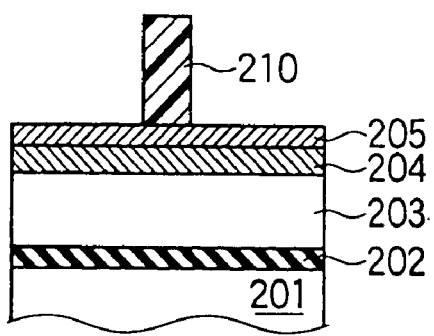
FIGS. 9A to 9H are schematic views of cross-sections of a wafer in the order of a conventional gate electrode forming process.
Figure 9E:
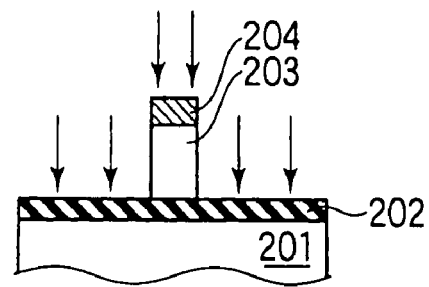
Figure 9B:
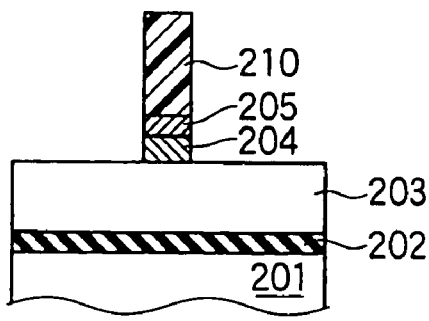
Figure 9F:
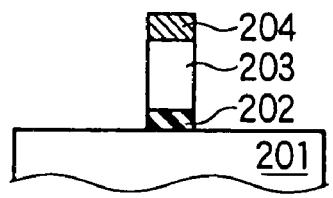
Figure 9C:
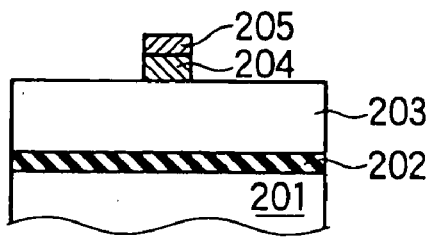
Figure 9G:
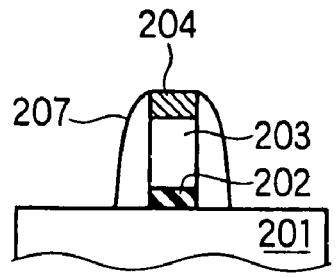
Figure 9D:
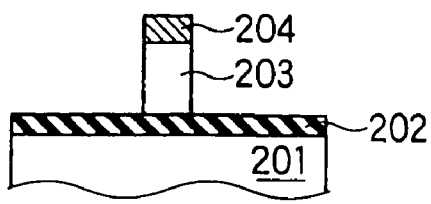
Figure 9H:

FIG. 8 is a schematic view of a dip-type cleaning apparatus 80 as an alternative example of the cleaning apparatus. The dip-type cleaning apparatus 80 includes a dual-structure vessel including an outer tank 81 and an inner tank 82, a bowl-like jig 83, a circulation channel 84 through which a chemical liquid passes, a pump 85, a filter 86, and a heat exchanger 87. The inner tank 82 is filled with a chemical liquid 88, and a plurality of wafers W vertically arranged with spaces therebetween are immersed in the inner tank 82 (in the chemical liquid 88) with the aid of the jig 83, whereby the wafers W are wet-cleaned. The chemical liquid overflowing from the inner tank 82 is circulated through the circulation channel 84 by the pump 85. The chemical liquid 88 passing the circulation channel 84 is filtered by the filter 86, so that foreign matters are removed from the chemical liquid 88. Then, after a temperature of the chemical liquid 88 is adjusted by the heat exchanger 87, the chemical liquid 88 is returned to the inner tank 82.

In the wet-cleaning by the dip-type cleaning apparatus 80, it is preferable to use the chemical liquid 88 containing HF and ethylene glycol with a mixed ratio thereof being 1:1 to 1:50, more preferably 1:10 to 1:20. It is also preferable that a temperature of the chemical liquid 88 is a room temperature, and the wafers are immersed in the chemical liquid for about 5 to 30 minutes.

Although the embodiments of the present invention have been described as above, the present invention is not limited thereto, and can be changed in various ways.

For example, in the above embodiments, a parallel plate plasma processing apparatus of a capacity-coupled type is used as the etching apparatus 1 and the ashing apparatus 60. However, as long as a plasma can be generated at a predetermined gas pressure, any type of plasma processing apparatus can be employed. For example, various plasma processing apparatuses of an inductively-coupled type may be used. Further, the etching apparatus 1 and the ashing apparatus 60 may be apparatuses of different types.

The invention claimed is:

1. A method of manufacturing a semiconductor device from a layered body including: a semiconductor substrate; a high dielectric film formed on the semiconductor substrate; and an SiC-based film formed on a position upper than the high dielectric film, the SiC-based film having an anti-reflective function and a hardmask function, the method comprising:
   a plasma-processing step for plasma-processing the SiC-based film and the high dielectric film to modify the SiC-based film and the high dielectric film by an action of a plasma; and
   a cleaning step for wet-cleaning the SiC-based film and the high dielectric film modified in the plasma-processing step to collectively remove the SiC-based film and the high dielectric film.

2. A method of manufacturing a semiconductor device from a layered body including: a semiconductor substrate; a high dielectric film formed on the semiconductor substrate; a polysilicon film formed on the high dielectric film; and an SiC-based film formed on a position upper than the polysilicon film, the SiC-based film having an anti-reflective function and a hardmask function,
   the method comprising:
   a first etching step for etching the SiC-based film by using a patterned resist as a mask;
   a second etching step for etching the polysilicon film by using the SiC-based film as a mask;
   a plasma-processing step for plasma-processing the SiC-based film and the high dielectric film exposed by the second etching step to modify the SiC-based film and the high dielectric film by an action of a plasma; and
   a cleaning step for wet-cleaning the SiC-based film and the high dielectric film modified in the plasma-processing step to collectively remove the SiC-based film and the high dielectric film.

3. The method of manufacturing a semiconductor device according to claim 1 or 2,
   wherein a process gas containing $O_2$ is used in the plasma-processing step.

4. The method of manufacturing a semiconductor device according to claim 3,
   wherein the process gas containing $O_2$ is a gas containing $O_2$ and $CF_4$, and a flowrate ratio of $O_2:CF_4$ is from 1000:5 to 1000:1.

5. The method of manufacturing a semiconductor device according to claim 1,
   wherein a chemical liquid containing hydrofluoric acid is used in the cleaning step.

6. The method of manufacturing a semiconductor device according to claim 5,
   wherein the chemical liquid containing hydrofluoric acid is a chemical liquid containing hydrofluoric acid and ethylene glycol.

7. A system of manufacturing a semiconductor device, comprising:
   an ashing apparatus for modifying a semiconductor substrate by a plasma;
   a cleaning apparatus for wet-cleaning a semiconductor substrate; and
   a controller for controlling the ashing apparatus and the cleaning apparatus to perform the method of manufacturing a semiconductor device according to claim 1.

8. A program for controlling the method of manufacturing a semiconductor device according to claim 1.

9. A computer-readable storage medium storing a program for controlling the method of manufacturing a semiconductor device according to claim 1.

* * * * *